US010020062B1

(12) United States Patent
Oh et al.

(10) Patent No.: US 10,020,062 B1
(45) Date of Patent: Jul. 10, 2018

(54) THREE DIMENSIONAL SEMICONDUCTOR MEMORY DEVICE AND SUB-BLOCK ERASING METHODS

(71) Applicant: SK hynix Inc., Gyeonggi-do (KR)

(72) Inventors: Sung-Lae Oh, Chungcheongbuk-do (KR); Jin-Ho Kim, Gyeonggi-do (KR); Dong-Hyuk Kim, Seoul (KR); Soo-Nam Jung, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/792,983

(22) Filed: Oct. 25, 2017

(30) Foreign Application Priority Data

Jun. 13, 2017 (KR) .................. 10-2017-0073749

(51) Int. Cl.
*G11C 16/16* (2006.01)
*G11C 16/04* (2006.01)
*H01L 27/11582* (2017.01)
*H01L 27/11514* (2017.01)
*G11C 16/34* (2006.01)

(52) U.S. Cl.
CPC .......... *G11C 16/16* (2013.01); *G11C 16/0483* (2013.01); *G11C 16/3477* (2013.01); *H01L 27/11514* (2013.01); *H01L 27/11582* (2013.01)

(58) Field of Classification Search
CPC . G11C 16/16; G11C 16/3477; G11C 16/0483; H01L 27/11514; H01L 27/11582
See application file for complete search history.

(56) References Cited

U.S. PATENT DOCUMENTS

2015/0003150 A1* 1/2015 Aritome ............. G11C 16/3427
365/185.02
2017/0040061 A1* 2/2017 Yeh .......................... G11C 16/14

FOREIGN PATENT DOCUMENTS

KR 1020150129940 11/2015
KR 1020170126772 11/2017

* cited by examiner

Primary Examiner — Ajay Ojha
(74) Attorney, Agent, or Firm — IP & T Group LLP

(57) ABSTRACT

A nonvolatile memory device includes well regions formed in a substrate and arranged in a first direction; a memory block including sub blocks which are formed over the substrate and correspond to the well regions, respectively; and bit lines disposed over the memory block, and extending in the first direction. Each of the sub blocks includes channel layers which are formed in a vertical direction between a corresponding well region and the bit lines, word lines and at least one drain select line and at least one erase prevention line, which are stacked over the substrate along the channel layers. In an erase operation, an erase voltage is applied to a well region corresponding to a selected sub block and an erase preventing voltage is applied to an erase prevention line included in an unselected sub block, the erase voltage may be prevented from being transferred to the unselected sub block.

20 Claims, 16 Drawing Sheets

Sub-Block1 : CSTR11, CSTR12, CSTR13, CSTR14
Sub-Block2 : CSTR21, CSTR22, CSTR23, CSTR24

FIG.5

|  | Sub-block1 | Sub-block2 |
|---|---|---|
| BL | Floating | Floating |
| EPL | Floating | Floating |
| DSL | Vdsl -> Floating | Vdsl -> Floating |
| DWL | Vss | Vss |
| WL | Vss | Vss |
| SSL | Floating | Floating |
| PW1 or PW2 | Verase | Vunerase |

FIG.7

|  | Sub-block1 | Sub-block2 |
|---|---|---|
| BL | Floating | Floating |
| EPL | Floating | Vprevent |
| DSL | Vdsl -> Floating | Vdsl -> Floating |
| DWL | Vss | Vss |
| WL | Vss | Vss |
| SSL | Floating | Floating |
| PW1 or PW2 | Verase | Vunerase |

Vprevent ≥ Verase

FIG.11

|  |  | Sub-block1 | Sub-block2 |
|---|---|---|---|
| BL | | Floating | Floating |
| EPL | DSL2 | Vdsl -> Floating | Vdsl -> Vprevent1(17V) |
| | DSL1 | Vdsl -> Floating | Vdsl -> Vprevent2(13V) |
| | DSL0 | Vdsl -> Floating | Vdsl -> Vprevent3(9V) |
| DWL | | Vss | Vss |
| WL | | Vss | Vss |
| SSL | | Floating | Floating |
| PW1 or PW2 | | Verase | Vunerase |

Verase > Vprevent1 > Vprevent2 > Vprevent3 > Vss

FIG.13

|  |  | Sub-block1 | Sub-block2 |
|---|---|---|---|
| BL |  | Floating | Floating |
| EPL | DSL2 | Vdsl -> Floating | Vdsl -> Vprevent1(17V) |
|  | DSL1 | Vdsl -> Floating | Vdsl -> Vprevent(13V) |
|  | DSL0 | Vdsl -> Floating | Vdsl -> Vprevent3(9V) |
|  | DWL | Vdsl -> Floating | Vdsl -> Vprevent4(5V) |
| WL |  | Vss | Vss |
| SSL |  | Floating | Floating |
| PW1 or PW2 |  | Verase | Vunerase |

Verase > Vprevent1 > Vprevent2 > Vprevent3 > Vprevent4 > Vss

THREE DIMENSIONAL SEMICONDUCTOR MEMORY DEVICE AND SUB-BLOCK ERASING METHODS

CROSS-REFERENCE TO RELATED APPLICATION

The present application claims priority to Korean Patent Application No. 10-2017-0073749 filed on Jun. 13, 2017, which is herein incorporated by reference in its entirety.

BACKGROUND

1. Technical Field

Various embodiments generally relate to a semiconductor memory device, and more particularly, to a nonvolatile memory device which may be erased by the unit of a sub block.

2. Related Art

A volatile memory device is a memory device in which stored data is removed when power supply is interrupted. A volatile memory device includes an SRAM (static random access memory), a DRAM (dynamic RAM), and an SDRAM (synchronous DRAM). A nonvolatile memory device is a memory device which retains data stored therein even when power supply is interrupted. A nonvolatile memory device includes a ROM (read only memory), a PROM (programmable ROM), an EPROM (electrically programmable ROM), an EEPROM (electrically erasable and programmable ROM), a FLASH memory, a PRAM (phase change RAM), an MRAM (magnetic RAM), an RRAM (resistive RAM), and an FRAM (ferroelectric RAM).

SUMMARY

In an embodiment, a nonvolatile memory device may include: a plurality of well regions formed in a substrate and arranged in a first direction; a memory block including a plurality of sub blocks which are formed over the substrate and correspond to the well regions, respectively; and a plurality of bit lines disposed over the memory block, and extending in the first direction. Each of the sub blocks may include a plurality of channel layers which are formed in a vertical direction between a corresponding well region and the bit lines, a plurality of word lines and at least one drain select line and at least one erase prevention line, which are stacked over the substrate along the channel layers. In an erase operation, an erase voltage is applied to a well region corresponding to a selected sub block and an erase preventing voltage is applied an erase prevention line included in an unselected sub block.

In an embodiment, a nonvolatile memory device may include: a plurality of well regions formed in a substrate and arranged in a first direction; a memory block including a plurality of sub blocks which are formed over the substrate and correspond to the well regions, respectively; and a plurality of bit lines disposed over the memory block, and extending in the first direction. Each of the sub blocks may include a plurality of channel layers which are formed in a vertical direction between a corresponding well region and the bit lines, a plurality of word lines and at least one drain select line, which are stacked over the substrate along the channel layers. In an erase operation, an erase voltage is applied to a well region corresponding to a selected sub block and an erase preventing voltage is applied to a drain select line of an unselected sub block.

In an embodiment, a nonvolatile memory device may include: a plurality of well regions formed in a substrate and arranged in a first direction; a memory block including a plurality of sub blocks which are formed over the substrate and correspond to the well regions, respectively; and a plurality of bit lines disposed over the memory block, and extending in the first direction. Each of the sub blocks may include a plurality of cell strings which are coupled between a corresponding well region and the bit lines, and each of the cell strings includes a plurality of memory cells and at least one erase prevention transistor, which are coupled between the corresponding well region and a corresponding bit line. In an erase operation, an erase voltage is applied to a well region corresponding to a selected sub block and an erase preventing voltage is applied to gates of erase prevention transistors of cell strings included in an unselected sub block.

BRIEF DESCRIPTION OF THE DRAWINGS

FIG. 5 is a table describing a bias condition in an erase operation of the memory block illustrated in FIG. 3.

FIG. 7 is a table explaining a bias condition in an erase operation of the memory block illustrated in FIG. 3.

FIG. 11 is a table describing a bias condition in an erase operation of the memory block illustrated in FIG. 10.

FIG. 13 is a table describing a bias condition in an erase operation of the memory block illustrated in FIG. 10.

DETAILED DESCRIPTION

Hereinafter, a nonvolatile memory device will be described below with reference to the accompanying drawings through various examples of embodiments.

Figure 1:
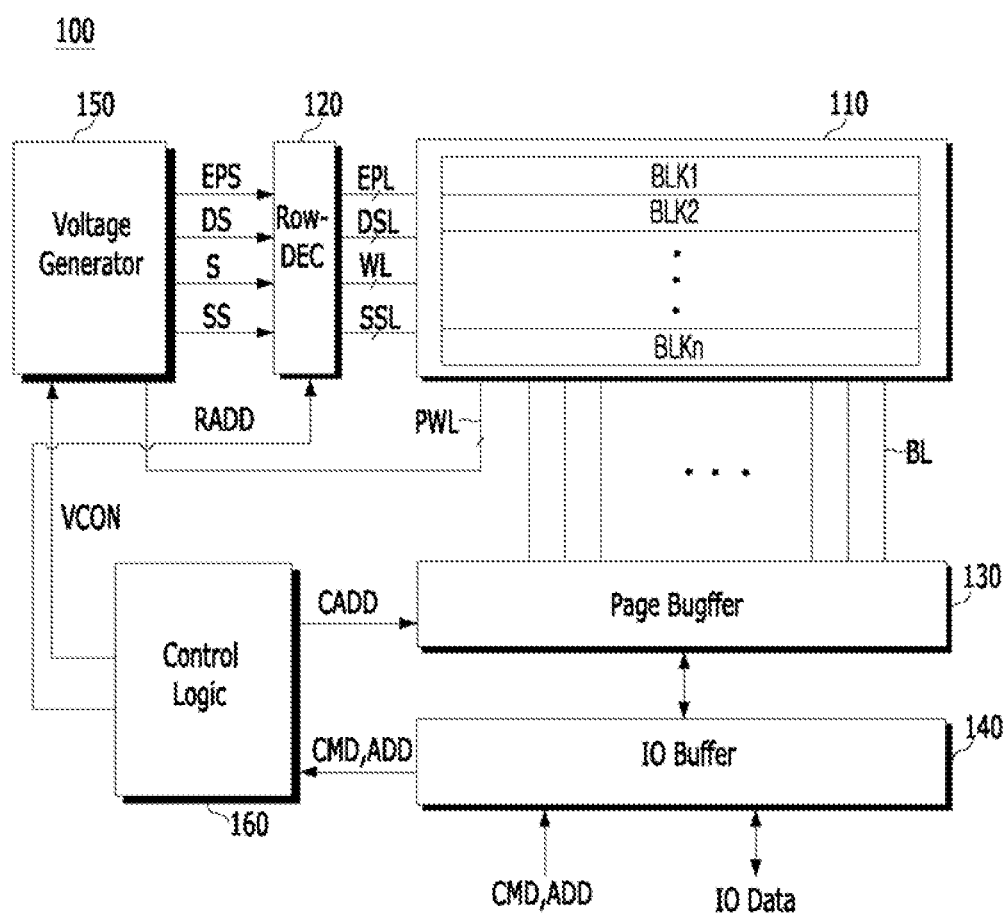
FIG. 1 is a block diagram illustrating a nonvolatile memory device in accordance with an embodiment of the present invention.

FIG. 1 is a block diagram illustrating a nonvolatile memory device 100 in accordance with an embodiment of the present invention.

Referring to FIG. 1, the nonvolatile memory device 100 in accordance with the embodiment may include a memory cell array 110 and peripheral circuits. The peripheral circuits may include a row decoder 120, a page buffer 130, an input/output buffer 140, a voltage generator 150, and a control logic 160.

The memory cell array 110 may be electrically coupled to the row decoder 120 through word lines WL and select lines DSL and SSL. The select lines DSL and SSL may include drain select lines DSL and source select lines SSL. The memory cell array 110 may be electrically coupled to the row decoder 120 through erase prevention lines EPL. The memory cell array 110 may be electrically coupled to the page buffer 130 through bit lines BL. The memory cell array 110 may be electrically coupled to the voltage generator 150 through well bias lines PWL.

The memory cell array 110 may include a plurality of memory blocks BLK1 to BLKn. Each of the memory blocks BLK1 to BLKn may include at least two sub blocks. A sub block may correspond to erase unit. Each of the sub blocks may include a plurality of cell strings. Each of the cell strings may include a plurality of memory cells which are disposed vertically on a substrate.

The word lines WL and the source select lines SSL may be respectively coupled to the memory blocks BLK1 to BLKn. The drain select lines DSL and the erase prevention lines EPL may be respectively coupled to the sub blocks. The bit lines BL may be coupled in common to the plurality of memory blocks BLK1 to BLKn.

The row decoder 120 may be configured to operate in response to control of the control logic 160. The row decoder 120 may receive a row address RADD from the control logic 160. The row decoder 120 may be configured to decode the received row address RADD. The row decoder 120 may select any one among the memory blocks BLK1 to BLKn included in the memory cell array 110, in response to the decoded row address RADD. The row decoder 120 may transfer operating voltages S, DS, SS and EPS from the voltage generator 150, to the word lines WL, the select lines DSL and SSL and the erase prevention lines EPL of a selected memory block.

The page buffer 130 may operate as a write driver or a sense amplifier depending on an operation mode. In a program operation, the page buffer 130 may transfer voltages corresponding to data to be programmed, to the bit lines BL of the memory cell array 110. In a read operation, the page buffer 130 may sense data stored in selected memory cells, through the bit lines BL, and transfer the sensed data to the input/output buffer 140. In an erase operation, the page buffer 130 may float the bit lines BL of the memory cell array 110.

In the program operation, the input/output buffer 140 may transfer write data inputted from an external device (not shown), to the page buffer 130. In the read operation, the input/output buffer 140 may output data provided from the page buffer 130, to the external device. The input/output buffer 140 may transfer an address ADD or a command CMD inputted from the external device, to the control logic 160.

The voltage generator 150 may be coupled to the row decoder 120 and the control logic 160. The voltage generator 150 may be configured to generate various voltages necessary for the program, read and erase operations, in response to a voltage control signal VCON of the control logic 160.

The voltages generated by the voltage generator 150 may be transferred to the plurality of lines EPL, DSL, WL and SSL coupled to the memory cell array 110, through the row decoder 120.

The voltage generator 150 may be coupled to the substrate of the memory cell array 110. A plurality of well regions which are formed in the substrate may be coupled to the voltage generator 150 through the well bias lines PWL. The voltages generated by the voltage generator 150 may be transferred to the substrate of the memory cell array 110 through the well bias lines PWL.

The control logic 160 may be coupled to the row decoder 120, the page buffer 130, the input/output buffer 140 and the voltage generator 150. The control logic 160 may output the voltage control signal VCON for generating the voltages necessary for the operation of the nonvolatile memory device 100, in response to the command CMD inputted through the input/output buffer 140. The control logic 160 may output the row address RADD and a column address CADD in response to the address ADD inputted through the input/output buffer 140.

In the erase operation, the control logic 160 may control the voltage generator 150 to generate and transfer an erase voltage and an unselect erase voltage to the well regions of the memory cell array 110. The control logic 160 may control the voltage generator 150 to apply the erase voltage to a well region corresponding to a selected sub block, in the erase operation. The control logic 160 may control the voltage generator 150 to apply the unselect erase voltage to a well region corresponding to an unselected sub block, in the erase operation. The control logic 160 may control the voltage generator 150 to apply the erase preventing voltage EPS to the erase prevention line EPL or the drain select line DSL of the unselected sub block, in the erase operation.

In order to improve the degree of integration of the nonvolatile memory device 100, it is necessary to increase the number of cell strings included in each of the memory blocks BLK1 to BLKn. In order to improve the efficiency of the nonvolatile memory device 100, it is necessary to shorten a time required to rewrite data after erasing the data stored in each of the memory blocks BLK1 to BLKn. If the number of cell strings included in each of the memory blocks BLK1 to BLKn is increased, when performing an erase operation according to an existing scheme in which erase is performed by unit of memory block, a lengthy time is required and thus memory efficiency deteriorates.

In the present embodiment, by dividing each of the memory blocks BLK1 to BLKn into at least two sub blocks, an erase operation may be performed by unit of sub block. Due to erase by the unit of sub block, a scheme of erasing a part of the capacity of a memory block may be realized. Thus, memory efficiency may be improved by quickly and efficiently erasing data having a small capacity.

Figure 2:
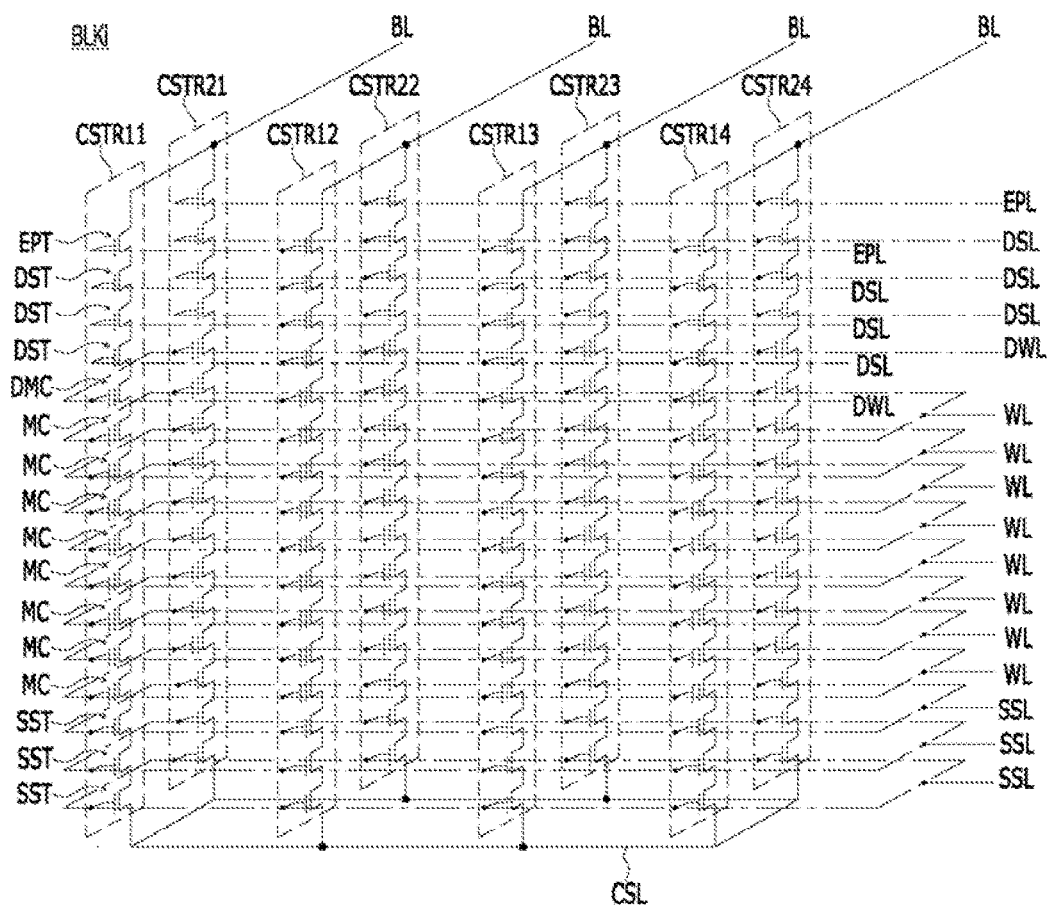
FIG. 2 is a circuit diagram illustrating one of the memory blocks illustrated in FIG. 1.
Figure 2:
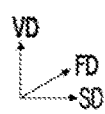

FIG. 2 is a circuit diagram illustrating one of the memory blocks BLK1 to BLKn illustrated in FIG. 1.

Referring to FIG. 2, a memory block BLKi may include a plurality of cell strings CSTR11 to CSTR24 which are coupled between a plurality of bit lines BL and a common source line CSL. The cell strings CSTR11 to CSTR24 may be configured in the same manner as one another.

Each of the cell strings CSTR11 to CSTR24 may be coupled between a bit line BL associated therewith and the common source line CSL.

Each of the cell strings CSTR11 to CSTR24 may include an erase prevention transistor EPT, a plurality of drain select transistors DST, a dummy memory cell DMC, a plurality of memory cells MC and a plurality of source select transistors SST, which are coupled in series between a bit line BL associated therewith and the common source line CSL. The memory cells MC represent memory cells which are used for storing valid data and the dummy memory cell DMC represents a memory cell which is not used for storing valid data.

The source select transistors SST, the memory cells MC, the dummy memory cell DMC, the drain select transistors DST and the erase prevention transistor EPT may be sequentially stacked in a vertical direction VD.

The gates of the source select transistors SST may be coupled to corresponding source select lines SSL, respectively. The gates of the memory cells MC may be coupled to corresponding word lines WL, respectively. The gate of the dummy memory cell DMC may be coupled to a corresponding dummy word line DWL. The gates of the drain select transistors DST may be coupled to corresponding drain select lines DSL, respectively. The gate of the erase prevention transistor EPT may be coupled to a corresponding erase prevention line EPL.

The common source line CSL may be formed in a substrate (not shown). The substrate may have a main surface which extends in a first direction FD and a second direction SD. The common source line CSL may extend in the second direction SD. The first direction FD and the second direction SD may be directions that are perpendicular to each other.

The bit lines BL may extend in the first direction FD, and be arranged in the second direction SD. The source select lines SSL, the word lines WL, the dummy word line DWL, the drain select lines DSL and the erase prevention line EPL may extend in the second direction SD.

The cell strings CSTR11 to CSTR24 may extend in the vertical direction VD that is perpendicular to the main surface of the substrate, and be arranged in the first direction FD and the second direction SD. In each of the cell strings CSTR11 to CSTR24, the height of the memory cell MC closest to the source select transistors SST is lowest, and the heights of the memory cells MC increase as the memory cells MC near the drain selection transistors DST.

The memory block BLKi may include a first sub block Sub-block1 and a second sub block Sub-block2. The first sub block Sub-block1 may include the cell strings CSTR11, CSTR12, CSTR13 and CSTR14, and the second sub block Sub-block2 may include the cell strings CSTR21, CSTR22, CSTR23 and CSTR24. The first sub block Sub-block1 and the second sub block Sub-block2 may be arranged in the first direction FD.

The cell strings CSTR11, CSTR12, CSTR13 and CSTR14 included in the first sub block Sub-block1 may be arranged in the second direction SD, and be respectively coupled to the bit lines BL. The cell strings CSTR21, CSTR22, CSTR23 and CSTR24 included in the second sub block Sub-block2 may also be arranged in the second direction SD, and be respectively coupled to the bit lines BL. In FIG. 2, the cell strings included in the same sub-block may be disposed on one line expending in the second direction. However, the cell strings included in the same sub-block may be disposed on two or more lines expending in the second direction. The cell strings arranged in the second direction are included in the same sub-block. The cell strings included in the different sub-blocks are not arranged in the second direction SD.

Two or more cell strings which are included in different sub blocks may be coupled in common to each of the bit lines BL. For example, the cell string CSTR11 included in the first sub block Sub-block1 and the cell string CSTR21 included in the second sub block Sub-block2 may be coupled in common to the bit line BL which is positioned leftmost in FIG. 2.

In the cell strings CSTR11 to CSTR24 included in the first and second sub blocks Sub-block1 and Sub-block2, source select transistors SST of the same height may share a source select line SSL. Herein, the term "height" means a distance from the substrate in the vertical direction VD. That is, the source select lines SSL of cell strings included in different sub blocks at the same height may be electrically coupled in common.

In the cell strings CSTR11 to CSTR24 included in the first and second sub blocks Sub-block1 and Sub-block2, memory cells MC of the same height may share a word line WL. That is, the word lines WL of cell strings included in different sub blocks at the same height may be electrically coupled in common.

The dummy memory cells DMC of cell strings arranged in the second direction SD at the same height in each of the first and second sub blocks Sub-block1 and Sub-block2 may share a dummy word line DWL. At the same height, the dummy memory cells DMC of cell strings included in different sub-block are not arranged in the second direction but the first direction FD. The dummy memory cells DMC of cell strings included in different sub blocks may be coupled to different dummy word lines DWL. The dummy memory cells DMC of cell strings included in different sub blocks at the same height do not share a dummy word line DWL. That is, the dummy word lines DWL of cell strings arranged in the second direction SD in the same sub block may be electrically coupled in common, and the dummy word lines DWL of cell strings included in different sub blocks may be electrically decoupled from each other.

The drain select transistors DST of cell strings arranged in the second direction SD at the same height in each of the first and second sub blocks Sub-block1 and Sub-block2 may share a drain select line DSL. At the same height, the drain select transistors DST of cell strings included in different sub-block are not arranged in the second direction SD but the first direction FD. The drain select transistors DST of cell strings included in different sub blocks at the same height are coupled to different drain select lines DSL. The drain select transistors DST of cell strings included in different sub blocks at the same height do not share a drain select line DSL. That is, at the same height, the drain select lines DSL of cell strings arranged in the second direction SD in the same sub block may be electrically coupled in common, and the drain select lines DSL of cell strings included in different sub blocks may be electrically decoupled from each other.

The erase prevention transistors EPT of cell strings arranged in the second direction SD in each of the first and second sub blocks Sub-block1 and Sub-block2 may share an erase prevention line EPL. At the same height, the erase prevention transistors EPT of cell strings included in different sub-block are not arranged in the second direction SD but the first direction FD. The erase prevention transistors EPT of cell strings included in different sub blocks do not share an erase prevention line EPL. That is, the erase prevention lines EPL of cell strings arranged in the second direction SD in the same sub block may be electrically coupled in common, and the erase prevention lines EPL of cell strings included in different sub blocks may be electrically decoupled from each other.

FIG. 2 illustrates that the memory block BLKi includes two sub blocks Sub-block1 and Sub-block2. However, the number of sub blocks included in a memory block is not limited thereto, and at least two sub blocks may be provided in the first direction FD.

In FIG. 2, each of the sub blocks Sub-block1 and Sub-block2 is illustrated as including four cell strings. However, the number of cell strings included in each of the sub blocks Sub-block1 and Sub-block2 is not limited thereto, and at least one cell string may be provided in the second direction SD in each of the sub blocks Sub-block1 and Sub-block2.

It is illustrated in FIG. 2 that three drain select transistors DST and three source select transistors SST are provided in each of the cell strings CSTR11 to CSTR24. However, at least one drain select transistor or at least one source select transistor may be provided in each of the cell strings CSTR11 to CSTR24.

It is illustrated in FIG. 2 that eight memory cells MC are included in each of the cell strings CSTR11 to CSTR24. However, at least one memory cell may be provided in each of the cell strings CSTR11 to CSTR24.

It is illustrated in FIG. 2 that each of the cell strings CSTR11 to CSTR24 includes one dummy memory cell DMC between the drain select transistors DST and the memory cells MC. However, each of the cell strings CSTR11 to CSTR24 may not include a dummy memory cell or include at least one dummy memory cells.

Figure 3:
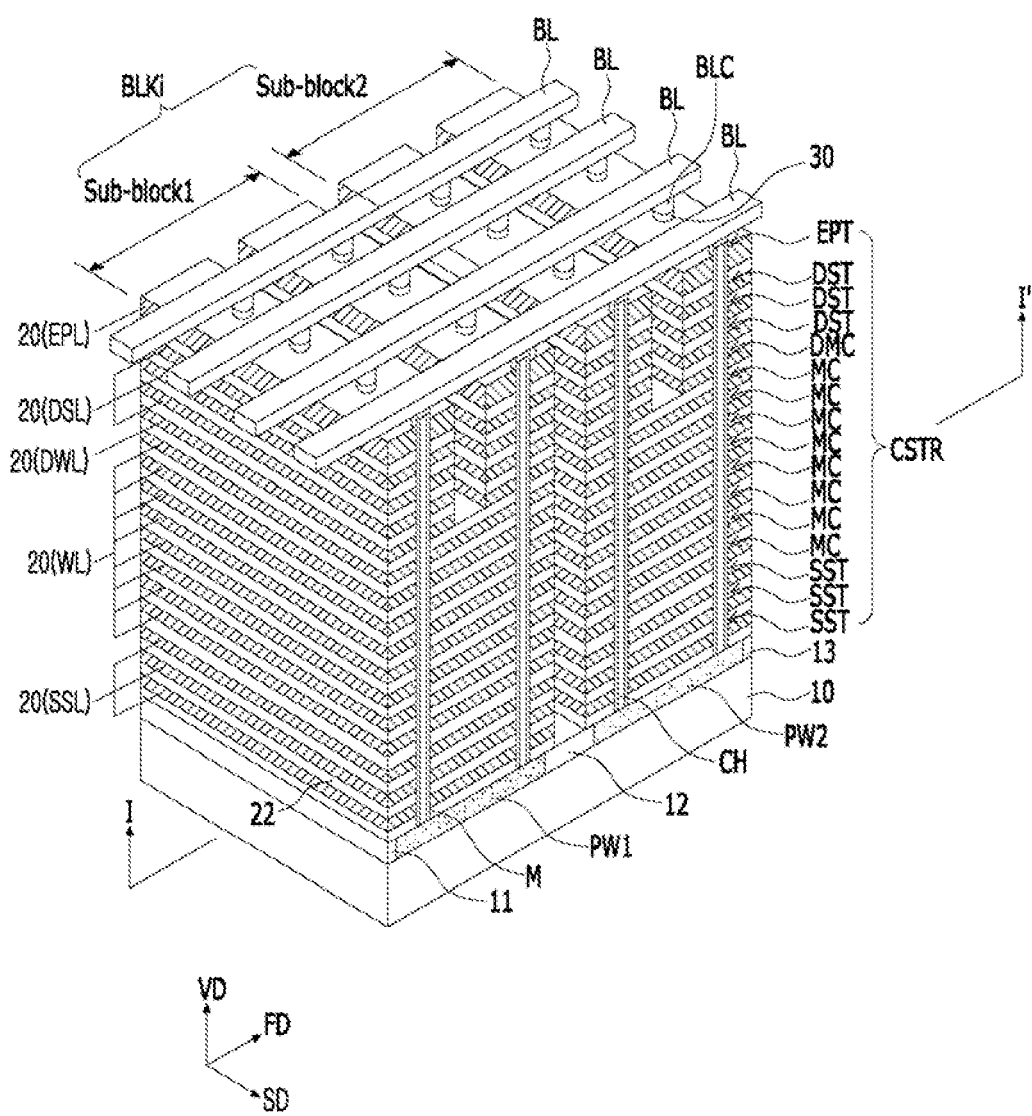
FIG. 3 is a perspective view illustrating one of the memory blocks illustrated in FIG. 1.
Figure 4:
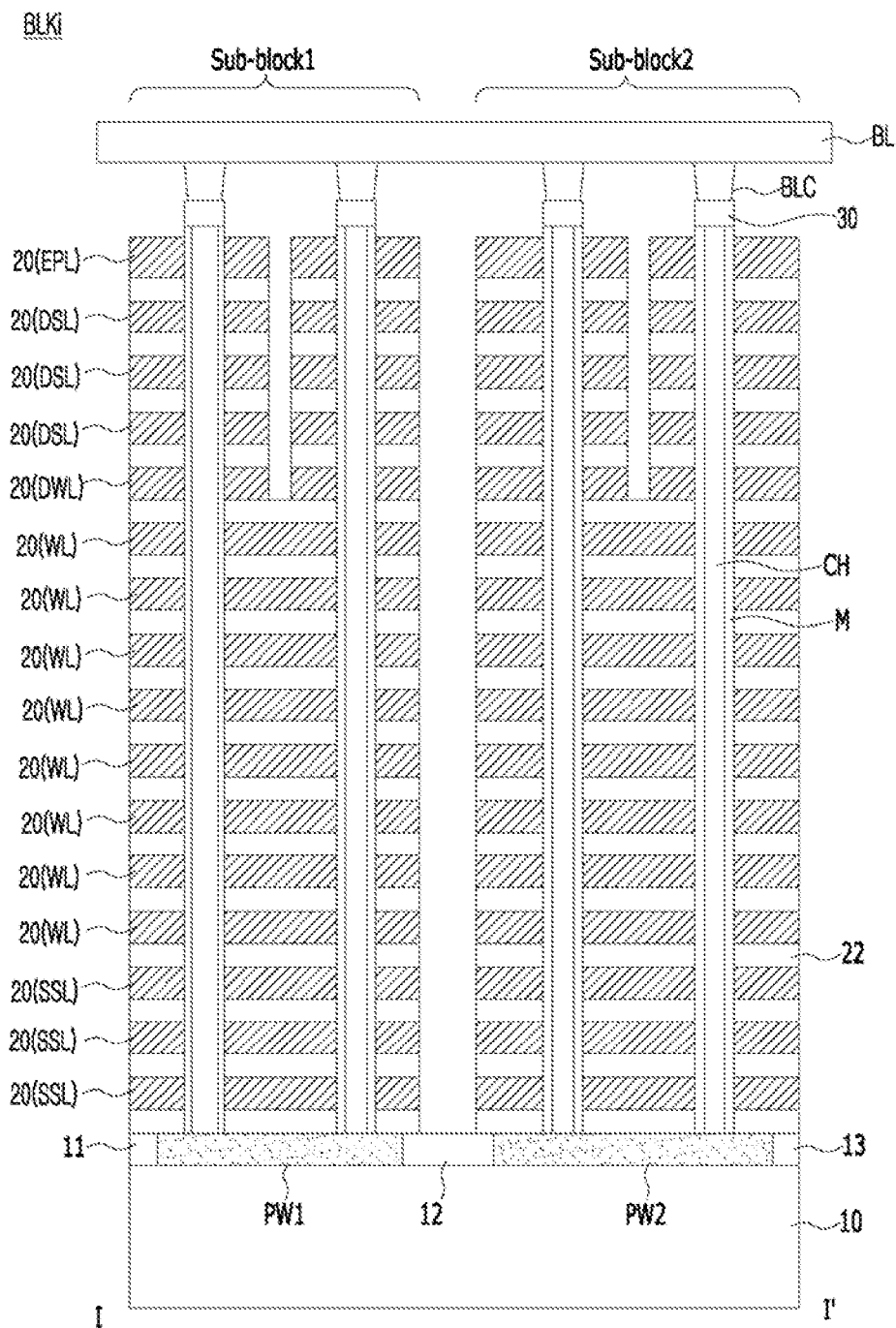
FIG. 4 is a cross-sectional view taken along the line I-I' of FIG. 3.

FIG. 3 is a perspective view illustrating one of the memory blocks BLK1 to BLKn illustrated in FIG. 1, and FIG. 4 is a cross-sectional view taken along the line I-I' of FIG. 3.

Referring to FIGS. 3 and 4, well regions PW1 and PW2 which are separated by a plurality of doping regions 11, 12 and 13 may be formed in a substrate 10.

The substrate 10 may have a main surface which extends in a first direction FD and a second direction SD that is perpendicular to the first direction FD. The substrate 10 may include polysilicon which is doped with an impurity. The substrate 10 may include silicon (Si), germanium (Ge) or a mixture thereof, and may be a semiconductor which is doped with a first conductivity type impurity, for example, a P-type impurity, or an intrinsic semiconductor which is not doped with an impurity. Alternatively, the substrate 10 may have a crystalline structure which includes at least any one selected among monocrystalline, amorphous and polycrystalline forms. The substrate 10 may include a polysilicon substrate, a silicon-on-insulator (SOI) substrate or a germanium-on-insulator (GeOI) substrate.

The doping regions 11, 12 and 13 may be formed by implanting an N-type impurity into the substrate 10. The doping regions 11, 12 and 13 may extend in the second direction SD, and be arranged in the first direction FD. The doping regions 11, 12 and 13 may operate as common source lines.

The well regions PW1 and PW2 may be disposed between the doping regions 11, 12 and 13. The well regions PW1 and PW2 may have a conductivity type different from the doping regions 11, 12 and 13. For example, the well regions PW1 and PW2 may be P-type wells which are doped with a P-type impurity. The well regions PW1 and PW2 may be implemented as a P-type well and an N-type well which overlap with each other.

A plurality of conductive layers 20 may be stacked on the substrate 10. The conductive layers 20 may include a metallic material or polysilicon.

The conductive layers 20 may include source select lines SSL, word lines WL, a dummy word line DWL, drain select lines DSL and an erase prevention line EPL. The source select lines SSL, the word lines WL, the dummy word line DWL, the drain select lines DSL and the erase prevention line EPL may be sequentially stacked in a vertical direction VD. Dielectric layers 22 may be disposed over and under each of the conductive lines 20.

A plurality of channel layers CH which pass through the conductive layers 20 and the dielectric layers 22 in the vertical direction VD may be formed on the respective well regions PW1 and PW2. The respective channel layers CH may contact the corresponding well regions PW1 and PW2 by passing through the conductive layers 20 and the dielectric layers 22.

In the present embodiment, each of the channel layers CH has a pillar structure which is completely filled up to the center thereof. However, the embodiment is not limited thereto. Each of the channel layers CH may have a tube shape in which a central region is open, and in this case, a dielectric layer may be filled in the central region that is open.

A memory layer M may be formed on the surfaces of the channel layers CH. The memory layer M may include a tunnel dielectric layer, a charge storage layer and a charge blocking layer or include at least one of them. The charge storage layer may include at least one of a floating gate, such as a polysilicon layer, which stores charges, a trap layer, such as a nitride layer, which traps charges, and a nano-dot. For reference, the memory layer M may include a phase change material in place of the charge storage layer. Further, a secondary memory layer (not shown) which is interposed between the memory layer M and the word lines WL and covers the top surfaces and bottom surfaces of the word lines WL may be additionally formed. The secondary memory layer may include a tunnel dielectric layer, a charge storage layer and a charge blocking layer or may include at least one of them. The charge blocking layer of the secondary memory layer may be a stack layer of an oxide layer and a high-k material layer.

Source select transistors SST may be formed at regions where the source select lines SSL surround the channel layers CH, memory cells MC may be formed at regions where the word lines WL surround the channel layers CH, dummy memory cells DMC may be formed at regions where the dummy word line DWL surrounds the channel layers CH, drain select transistors DST may be formed at regions where the drain select lines DSL surround the channel layers CH, and erase prevention transistors EPT may be formed at regions where the erase prevention line EPL surrounds the channel layers CH.

By the above-described structure, a plurality of cell strings CSTR including the source select transistors SST, the memory cells MC, the dummy memory cells DMC, the drain select transistors DST and the erase prevention transistors EPT, which are disposed along the respective channel layers CH, may be constructed.

In an erase operation, the control logic 160 (see FIG. 1) may control the voltage generator 150 (see FIG. 1) to independently apply voltages to the plurality of well regions PW1 and PW2. Cell strings corresponding to each of the well regions PW1 and PW2 may construct a sub block. In the nonvolatile memory device 100 in accordance with the embodiment, an erase operation may be performed by unit of sub block by independently applying voltages to the plurality of well regions PW1 and PW2.

Sub blocks Sub-block1 and Sub-block2 may divide the cell strings CSTR included in a memory block BLKi, into a plurality of sub groups. As the well regions PW1 and PW2 are arranged in the first direction FD, the sub blocks Sub-block1 and Sub-block2 are arranged in the first direction FD as well.

Hereunder, a sub block corresponding to the well region PW1 is defined as a first sub block Sub-block1, and a sub block corresponding to the well region PW2 is defined as a second sub block Sub-block2.

Drains 30 may be disposed on the channel layers CH, respectively. The drains 30 may include a silicon material which is doped with an impurity. For example, the drains 30 may include an N-type silicon.

Bit line contacts BLC may be disposed on the drains 30, respectively. Bit lines BL may be coupled to the drains 30 through the bit line contacts BLC. The bit lines BL may extend in the first direction FD, and be arranged in the second direction SD. Channel layers CH of the cell strings CSTR which are included in the different sub blocks and arranged in line along the first direction FD may be coupled in common to a single bit line BL.

Several channel layers CH of cell strings CSTR included in the first sub block Sub-block1 and several channel layers CH of cell strings CSTR included in the second sub block Sub-block2 may be disposed in line along the first direction FD. Therefore, several cell strings CSTR included in the first sub block Sub-block1 and several cell strings CSTR included in the second sub block Sub-block2 may be coupled in common to a single bit line BL.

Since cell strings CSTR included in different sub blocks are coupled in common to a single bit line BL, as an erase voltage applied to a selected sub block in an erase operation is transferred to an unselected sub block through the bit line BL, the unselected sub block is erased in an unwanted manner.

Figure 6:
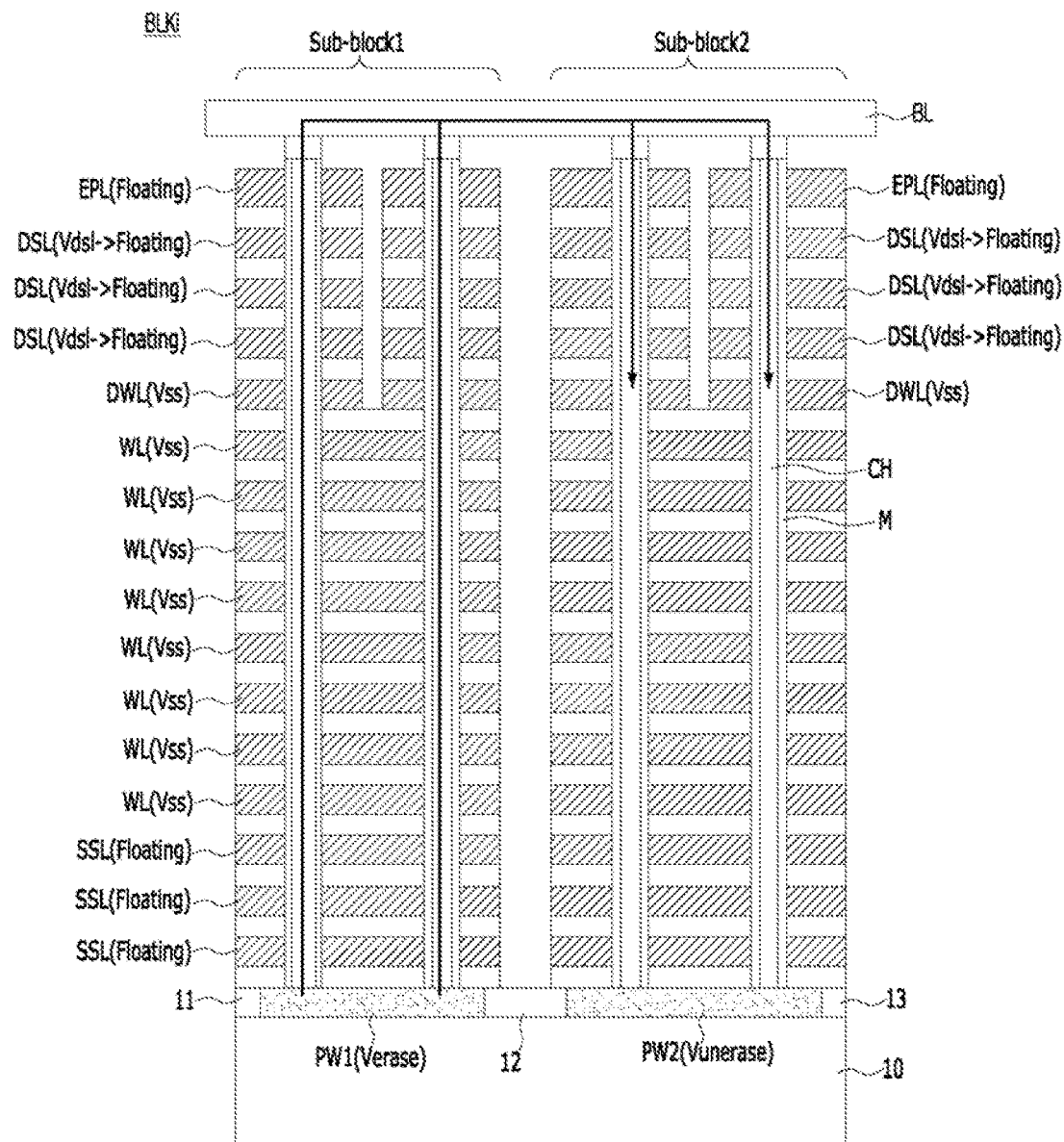
FIG. 6 is a cross-sectional view illustrating a state of the memory block in the erase operation according to the bias condition of FIG. 5.

FIG. 5 is a table describing a bias condition in an erase operation of the memory block BLKi illustrated in FIG. 3, and FIG. 6 is a cross-sectional view illustrating a state of the memory block BLKi in the erase operation according to the bias condition of FIG. 5.

As an example, from among the first and second sub blocks Sub-block1 and Sub-block2 included in the memory block BLKi, the first sub block Sub-block1 is selected to be erased and the second sub block Sub-block2 is selected not to be erased.

In an erase operation, a select voltage is applied to the word lines WL, and the bit lines BL and the source select lines SSL are floated. The select voltage is applied to the dummy word line DWL of the first sub block Sub-block1 and the dummy word line DWL of the second sub block Sub-block2. The erase prevention line EPL of the first sub block Sub-block1 and the erase prevention line EPL of the second sub block Sub-block2 are floated.

An erase voltage Verase is applied to the well region PW1 corresponding to the selected first sub block Sub-block1, and an unselect erase voltage Vunerase may be applied to the well region PW2 corresponding to the unselected second sub block Sub-block2. The select voltage may be a ground voltage Vss. The erase voltage Verase may have a level of 20V, and the unselect erase voltage Vunerase may be the ground voltage Vss.

After the drain select lines DSL of the first sub block Sub-block1 and the drain select lines DSL of the second sub block Sub-block2 are provided with a turn-on voltage Vdsl, they are floated after a predetermined time passes from a point of time when the erase voltage Verase is applied to the well region PW1.

Under this bias condition, as the potential of the channel layers CH included in the first sub block Sub-block1 rises to the level of the erase voltage Verase, the erase voltage Verase is applied between the word lines WL and the channel layers CH included in the first sub block Sub-block1, and the memory cells MC included in the first sub block Sub-block1 are erased by F-N tunneling.

Since the drain select lines DSL and the erase prevention lines EPL of the first and second sub blocks Sub-block1 and Sub-block2 are in the floated state, the erase voltage Verase transferred to the channel layers CH of the first sub block Sub-block1 is transferred to the channel layers CH of the unselected second sub block Sub-block2 through the bit lines BL. Since the ground voltage Vss is applied to the word lines WL, the erase voltage Verase is applied between the channel layers CH included in the second sub block Sub-block2 and the word lines WL, and the memory cells MC of the unselected second sub block Sub-block2 are erased by F-N tunneling in an unwanted manner.

Figure 8:
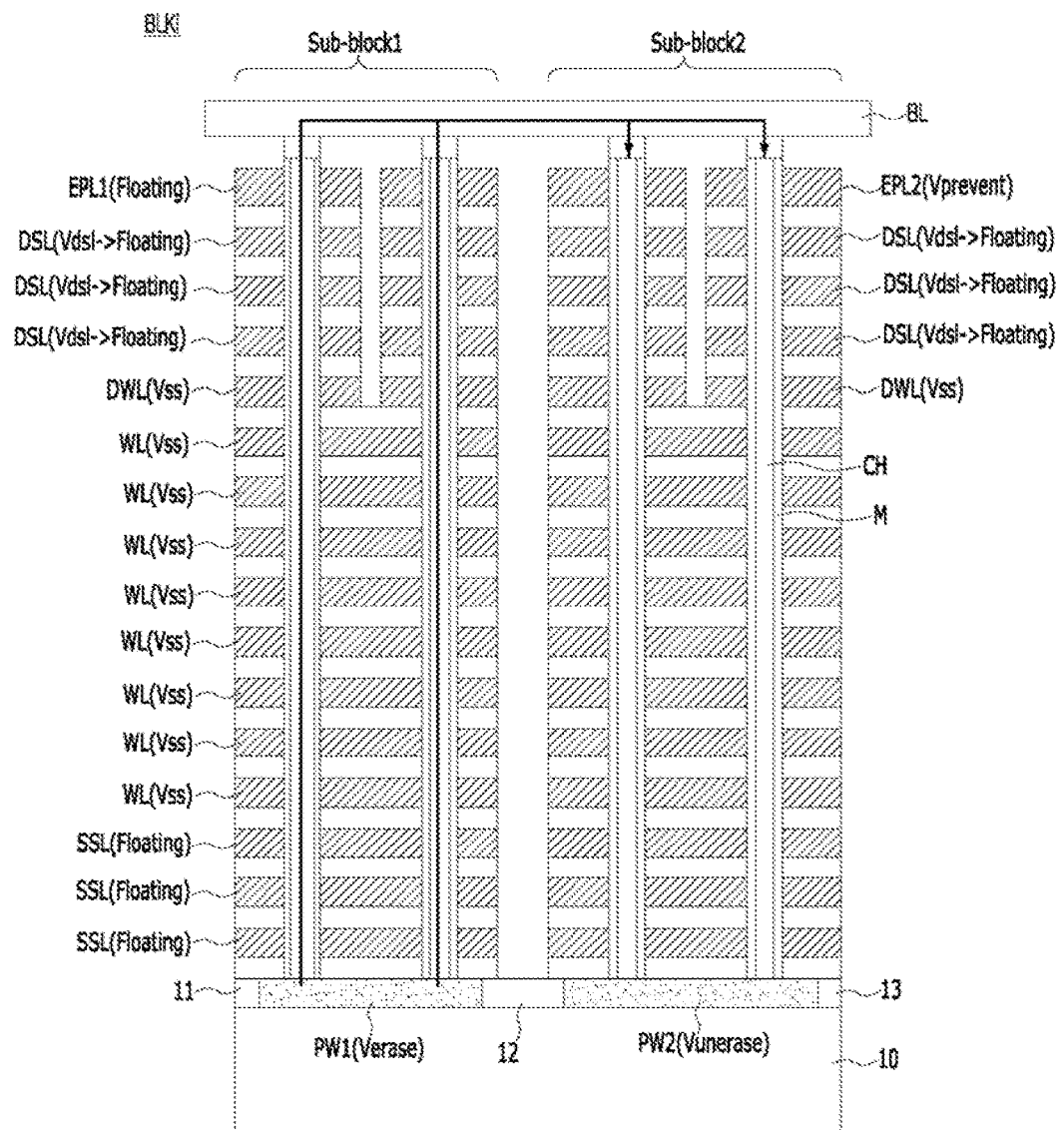
FIG. 8 is a cross-sectional view illustrating a state of the memory block in the erase operation according to the bias condition of FIG. 7.

FIG. 7 is a table describing a bias condition in an erase operation of the memory block BLKi illustrated in FIG. 3, and FIG. 8 is a cross-sectional view illustrating a state of the memory block BLKi in the erase operation according to the bias condition of FIG. 7.

As an example, from among the first and second sub blocks Sub-block1 and Sub-block2 included in the memory block BLKi, the first sub block Sub-block1 is selected to be erased and the second sub block Sub-block2 is selected not to be erased.

In an erase operation, a select voltage is applied to the word lines WL, and the bit lines BL and the source select lines SSL are floated. The select voltage is applied to the dummy word line DWL of the first sub block Sub-block1 and the dummy word line DWL of the second sub block Sub-block2.

An erase voltage Verase is applied to the well region PW1 corresponding to the selected first sub block Sub-block1, and an unselect erase voltage Vunerase may be applied to the well region PW2 corresponding to the unselected second sub block Sub-block2. The select voltage may be a ground voltage Vss. The erase voltage Verase may have a level of 20V, and the unselect erase voltage Vunerase may be the ground voltage Vss.

An erase preventing voltage Vprevent which has a level equal to or higher than the erase voltage Verase is applied to the erase prevention line EPL of the unselected second sub block Sub-block2. The erase prevention line EPL of the selected first sub block Sub-block1 is floated. Alternatively, the erase preventing voltage Vprevent is applied to the erase prevention line EPL of the selected first sub block Sub-block1.

After the drain select lines DSL of the first sub block Sub-block1 and the drain select lines DSL of the second sub block Sub-block2 are provided with a turn-on voltage Vdsl, they are floated after a predetermined time passes from a point of time when the erase voltage Verase is applied to the well region PW1.

Under this bias condition, as the erase voltage Verase is applied between the word lines WL and the channel layers CH included in the first sub block Sub-block1, the memory cells MC included in the first sub block Sub-block1 are erased by F-N tunneling.

Since the drain select lines DSL and the erase prevention line EPL of the first sub block Sub-block1 are in the floated state, the erase voltage Verase transferred to the channel layers CH of the first sub block Sub-block1 is transferred to the bit lines BL.

Due to the fact that the erase voltage Verase is applied to the erase prevention line EPL of the second sub block Sub-block2, the erase prevention transistors EPT of the second sub block Sub-block2 are turned off. Accordingly, it is possible to prevent the erase voltage Verase of the bit lines BL from being transferred to the second sub block Sub-block2, and it is possible to prevent the memory cells MC of the unselected second sub block Sub-block2 from being erased in an unwanted manner.

In the examples described above with reference to FIGS. 2 to 4, 7 and 8, it is illustrated that the cell strings CSTR include erase prevention transistors separately from drain select transistors. However, the present invention is not limited thereto, and the erase prevention transistors may be implemented in various manners.

Figure 9:
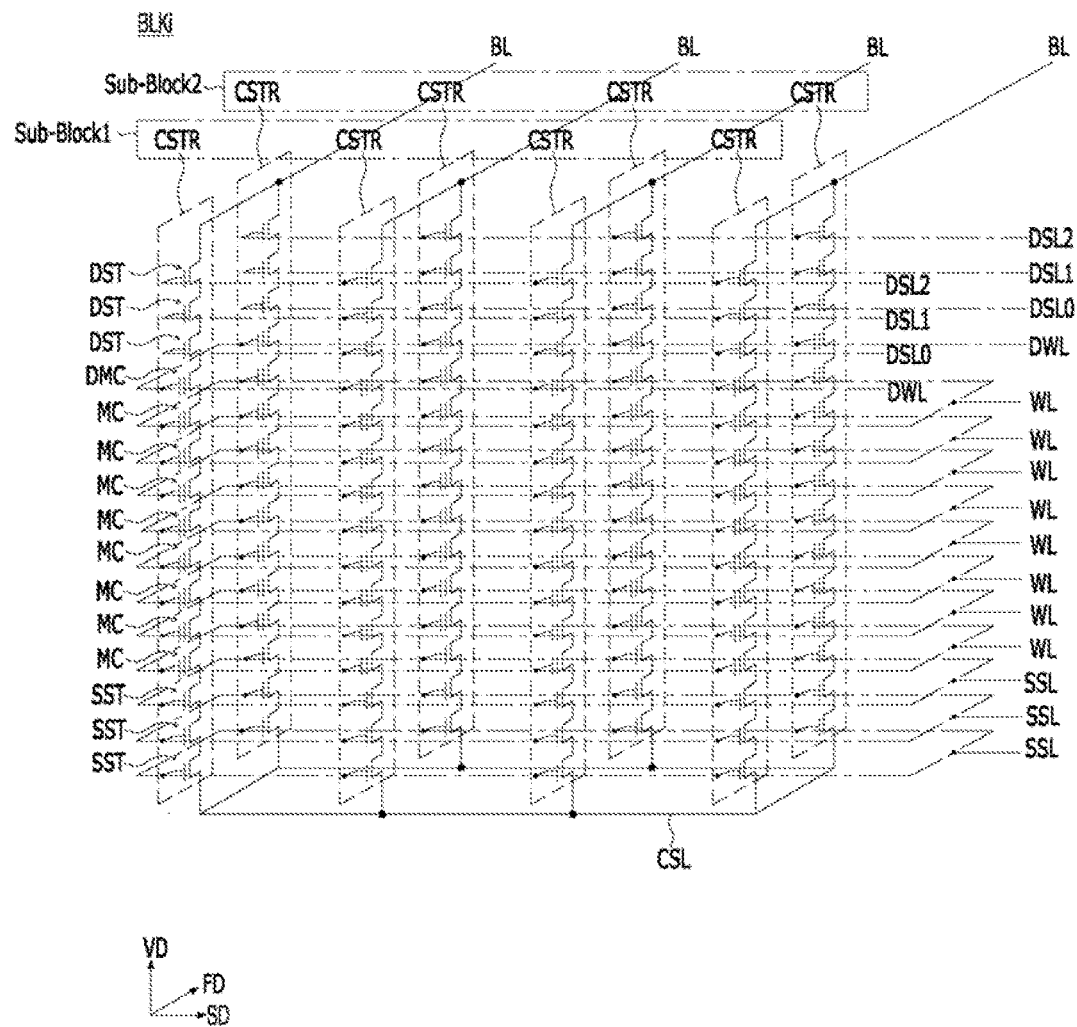
FIG. 9 is a circuit diagram illustrating one of the memory blocks illustrated in FIG. 1.
Figure 10:
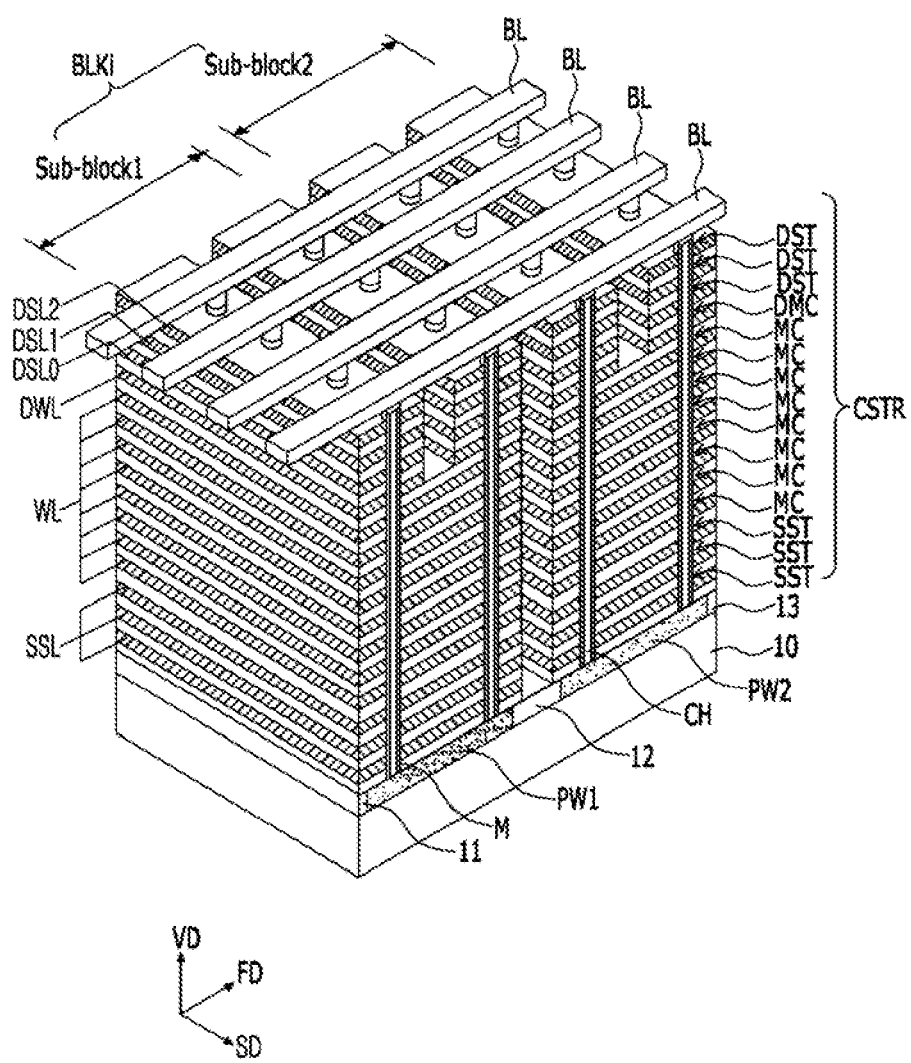
FIG. 10 is a perspective view illustrating one of the memory blocks illustrated in FIG. 1.

FIG. 9 is a circuit diagram illustrating one of the memory blocks BLK1 to BLKn illustrated in FIG. 1, and FIG. 10 is a perspective view illustrating one of the memory blocks BLK1 to BLKn illustrated in FIG. 1.

Referring to FIGS. 9 and 10, components of FIGS. 9 and 10 are substantially the same as those of FIGS. 2 and 3, respectively, except that cell strings CSTR may not include separate erase prevention transistors but drain select transistors DST included in each of the cell strings CSTR may operate as the erase prevention transistors. Since circuit configurations and disposition of the memory block BLKi have been described, their detailed description will be omitted.

Figure 12:
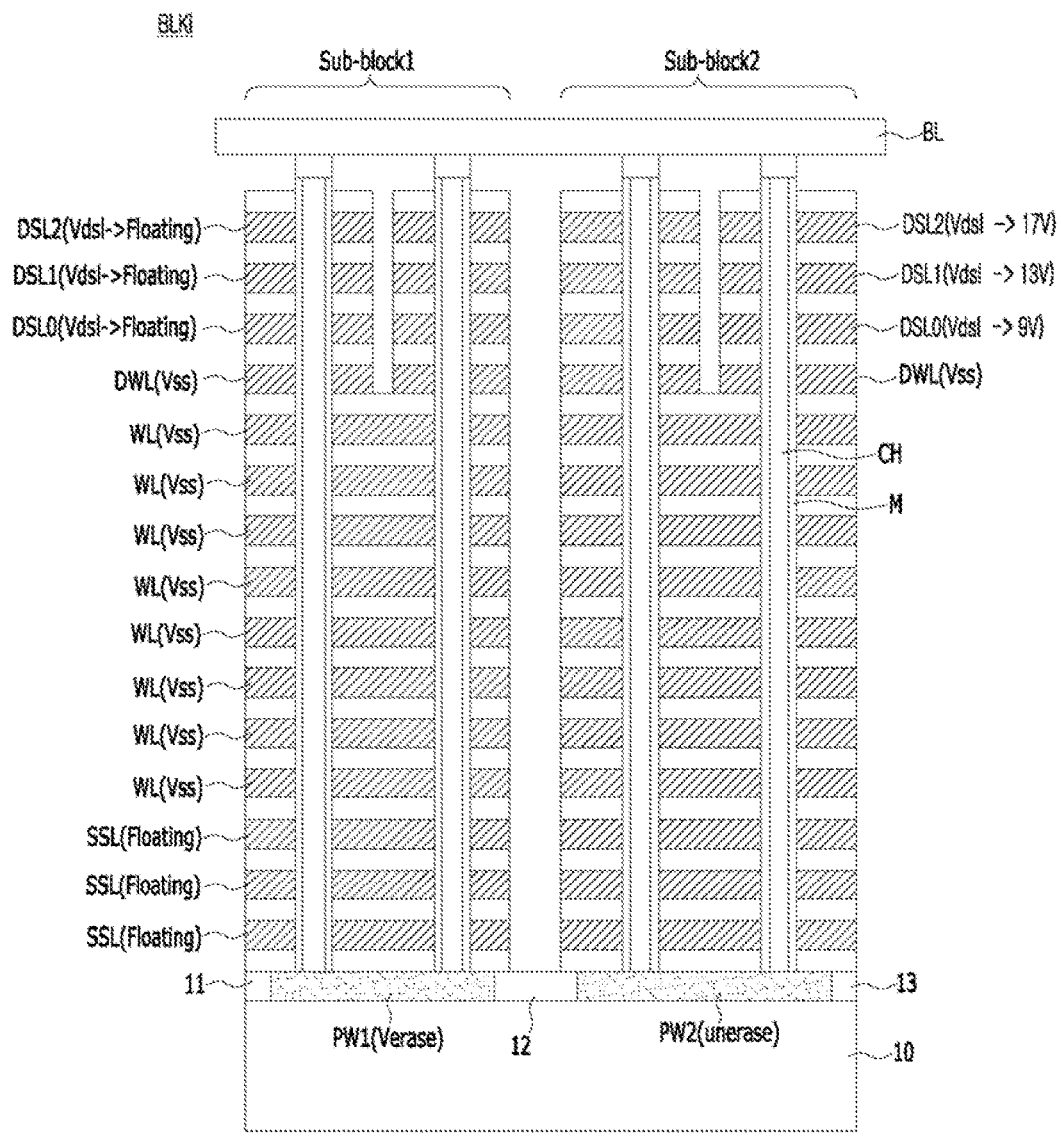
FIG. 12 is a cross-sectional view illustrating a state of the memory block in the erase operation according to the bias condition of FIG. 11.

FIG. 11 is a table describing a bias condition in an erase operation of the memory block BLKi illustrated in FIG. 10, and FIG. 12 is a cross-sectional view illustrating a state of the memory block BLKi in the erase operation according to the bias condition of FIG. 11.

As an example, from among the first and second sub blocks Sub-block1 and Sub-block2 included in the memory block BLKi, the first sub block Sub-block1 is selected to be erased and the second sub block Sub-block2 is selected not to be erased.

In an erase operation, a select voltage is applied to the word lines WL, and the bit lines BL and the source select lines SSL are floated. The select voltage is applied to the dummy word line DWL of the first sub block Sub-block1 and the dummy word line DWL of the second sub block Sub-block2.

An erase voltage Verase is applied to the well region PW1 corresponding to the selected first sub block Sub-block1, and an unselect erase voltage Vunerase may be applied to the well region PW2 corresponding to the unselected second sub block Sub-block2. The select voltage may be a ground voltage Vss. The erase voltage Verase may have a level of 20V, and the unselect erase voltage Vunerase may be the ground voltage Vss.

After drain select lines DSL0, DSL1 and DSL2 of the selected first sub block Sub-block1 are provided with a turn-on voltage Vdsl, they are floated after a predetermined time passes from a point of time when the erase voltage Verase is applied to the well region PW1.

When a predetermined time passes after the turn-on voltage Vdsl is applied to drain select lines DSL0, DSL1 and DSL2 of the unselected second sub block Sub-block2, erase preventing voltages Vprevent1, Vprevent2 and Vprevent3 are applied to the drain select lines DSL0, DSL1 and DSL2 of the unselected second sub block Sub-block2, respectively. The erase preventing voltages Vprevent1, Vprevent2 and Vprevent3 have levels which are lower than the erase voltage Verase and higher than the select voltage. When the plurality of drain select lines DSL0, DSL1 and DSL2 are sequentially stacked over a substrate 10 as in the present embodiment, a highest erase preventing voltage may be applied to the uppermost drain select line DSL2, and, as a drain select line is closer to the word lines WL, an erase preventing voltage having a lower level may be applied to the drain select line. For example, when the select voltage is the ground voltage Vss and the erase voltage Verase is 20V, the erase preventing voltage Vprevent1 applied to the uppermost drain select line DSL2 may be 17V, the erase preventing voltage Vprevent2 applied to the intermediately positioned drain select line DSL1 may be 13V, and erase preventing voltage Vprevent3 applied to the lowermost drain select line DSL0 may be 9V.

Under this bias condition, as the erase voltage Verase is applied between the word lines WL and the channel layers CH of the first sub block Sub-block1, the memory cells MC included in the first sub block Sub-block1 are erased by F-N tunneling.

Since the drain select lines DSL0, DSL1 and DSL2 of the first sub block Sub-block1 are in the floated state, the erase voltage Verase transferred to the channel layers CH of the first sub block Sub-block1 is transferred to the bit lines BL.

Due to the fact that the erase preventing voltages Vprevent1, Vprevent2 and Vprevent3, which are lower than the erase voltage Verase and higher than the ground voltage Vss, are applied to the drain select lines DSL2, DSL1 and DSL0 of the unselected second sub block Sub-block2, a voltage lower than the erase preventing voltage Vprevent3 applied to the lower most drain select line DSL0 is transferred to the channel layers CH of the second sub block Sub-block2. Therefore, since the potential difference between a channel voltage of the memory cells MC included in the second sub block Sub-block2 and the voltage Vss applied to the word lines WL is lower than a potential difference necessary for F-N tunneling, it is possible to prevent the memory cells MC of the unselected second sub block Sub-block2 from being erased in an unwanted manner.

In the example of FIGS. 11 and 12, it is illustrated that only drain select transistors operate as erase prevention transistors. However, a dummy memory cell as well as drain select transistors may operate as erase prevention transistors.

Figure 14:
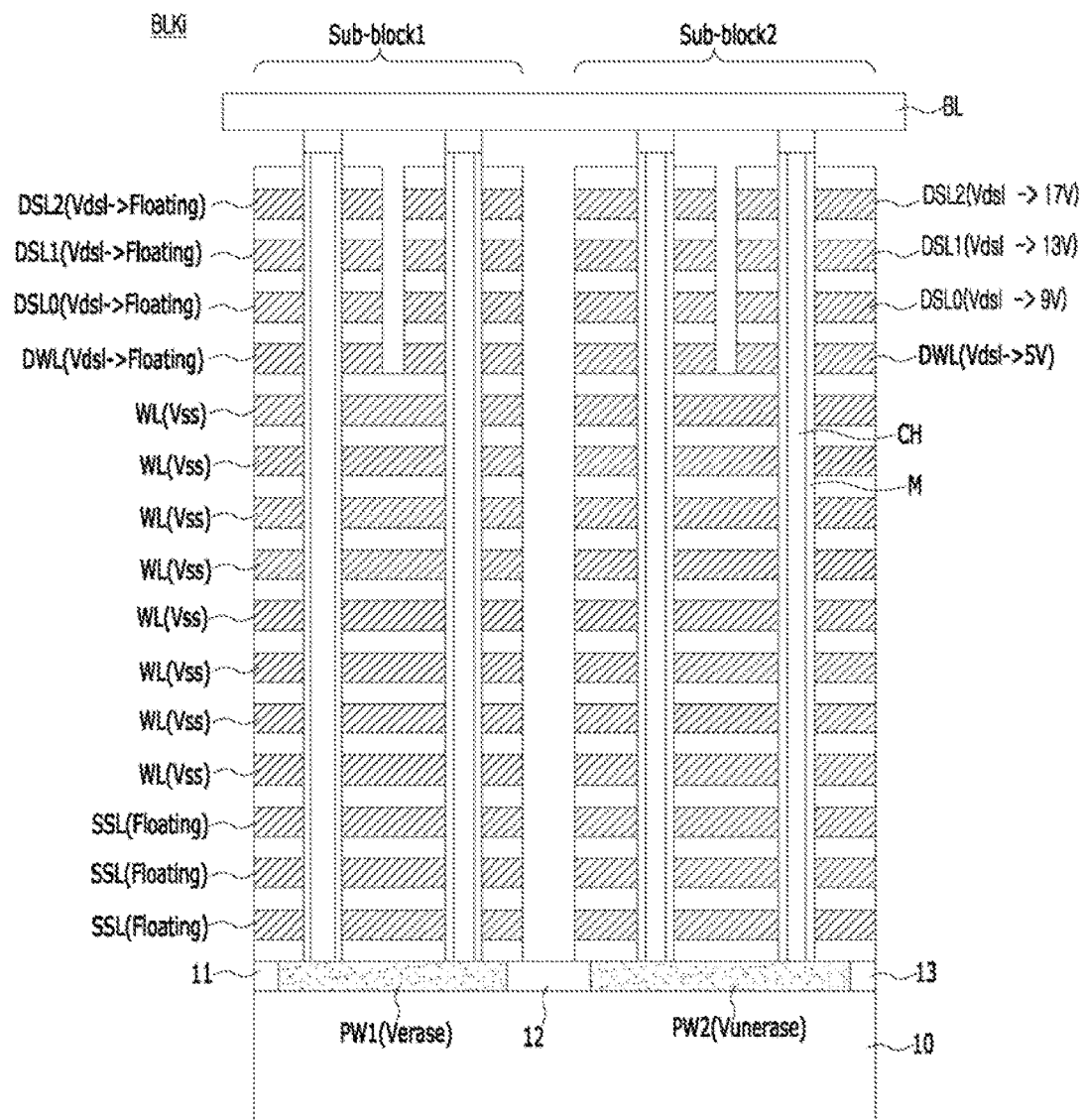
FIG. 14 is a cross-sectional view illustrating a state of the memory block in the erase operation according to the bias condition of FIG. 13.

FIG. 13 is a table describing a bias condition in an erase operation of the memory block BLKi illustrated in FIG. 10, and FIG. 14 is a cross-sectional view illustrating a state of the memory block BLKi in the erase operation according to the bias condition of FIG. 13.

As illustrated in FIGS. 13 and 14, an erase preventing voltage Vprevent4 which is lower than the erase preventing voltage Vprevent3 applied to the lowermost drain select line DSL0 and higher than the select voltage which is applied to the dummy word line DWL. For example, the erase preventing voltage Vprevent3 of 9V is applied to the lowermost drain select line DSL0, and, when the select voltage is the ground voltage Vss, the erase preventing voltage Vprevent4 of 5V may be applied to the dummy word line DWL.

Then a voltage lower than the voltage of 5V applied to the dummy word line DWL is transferred to the channel layers CH of the second sub block Sub-block2. Therefore, since the potential difference between a channel voltage of the memory cells MC included in the second sub block Sub-block2 and the voltage Vss applied to the word lines WL is lower than a potential difference necessary for F-N tunneling, it is possible to prevent the memory cells MC of the unselected second sub block Sub-block2 from being erased in an unwanted manner.

Figure 15:
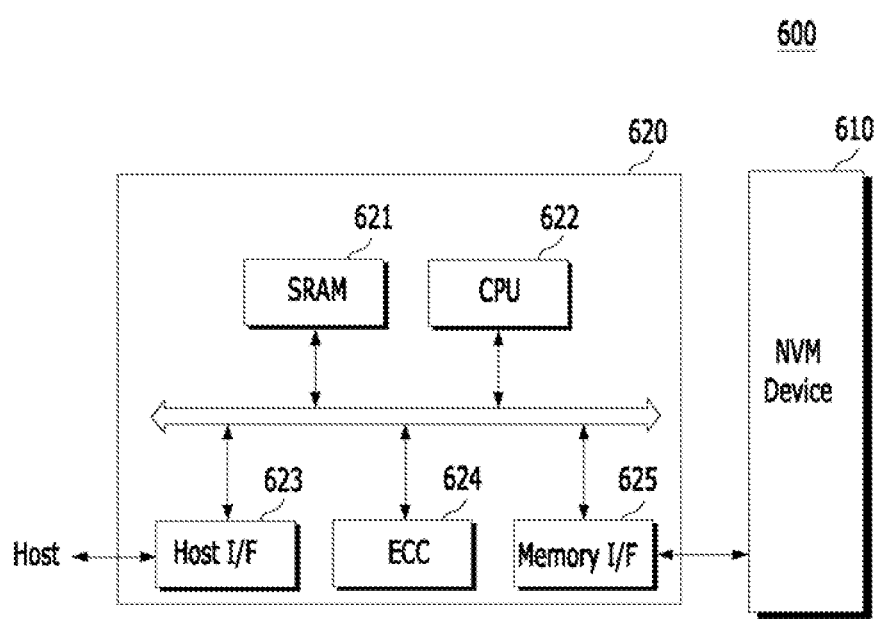
FIG. 15 is a block diagram schematically illustrating a memory system including a nonvolatile memory device in accordance with an embodiment of the present invention.

FIG. 15 is a block diagram schematically illustrating a memory system 600 including a nonvolatile memory device 610 according to an embodiment of the present invention.

Referring to FIG. 15, the memory system 600 may include the nonvolatile memory device 610 and a memory controller 620.

The nonvolatile memory device 610 may include the nonvolatile memory device according to an embodiment of the invention as described above, and may be operated in the manner described above. The memory controller 620 may control the nonvolatile memory device 610. For example, the combination of the nonvolatile memory device 610 and the memory controller 620, may be configured as a memory card or a solid state disk (SSD). The memory controller 620 may include a static random access memory (SRAM) 621, a central processing unit (CPU) 622, a host interface 623, an error correction code (ECC) block 624, a memory interface 625.

The SRAM 621 may be used as the working memory of the CPU 622. The host interface 623 may include the data exchange protocol of a host which may be coupled to the memory system 600.

The ECC block 624 may detect and correct an error included in the data read out from the nonvolatile memory device 610.

The memory interface 625 may interface with the nonvolatile memory device 610. The CPU 622 may perform general control operations for data exchange of the memory controller 620.

Although not shown, it should become apparent to a person skilled in the art that the memory system 600 may further be provided with a ROM which stores code data for interfacing with the host. The nonvolatile memory device 610 may be provided as a multi-chip package constructed with a plurality of flash memory chips.

The memory system 600 may be used as a storage medium of high reliability having a low probability of an error occurring. The aforementioned nonvolatile memory device may be provided for a memory system such as a solid state disk (SSD). The memory controller 620 may communicate with an external device (for example, the host) through one of various interface protocols such as a USB (universal serial bus) protocol, an MMC (multimedia card) protocol, a PCI-E (peripheral component interconnection express) protocol, an SATA (serial advanced technology attachment) protocol, a PATA (parallel advanced technology attachment) protocol, an SCSI (small computer system interface) protocol, an ESDI (enhanced small disk interface) protocol and an IDE (integrated device electronics) protocol and the like.

Figure 16:
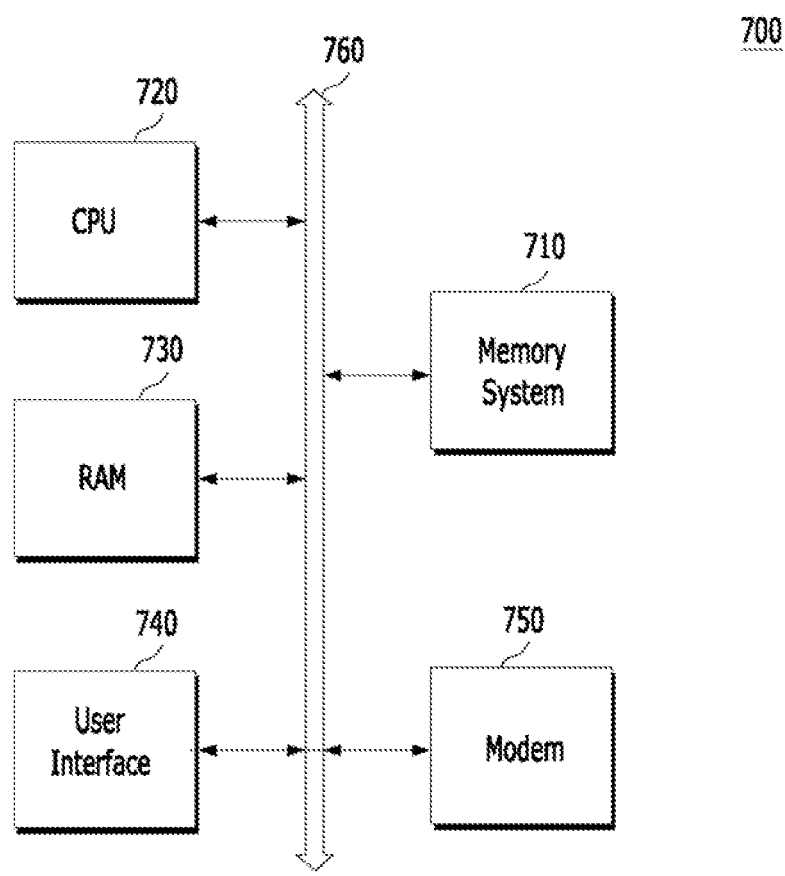
FIG. 16 is a block diagram schematically illustrating computing system including a nonvolatile memory device in accordance with an embodiment of the present invention.

FIG. 16 is a block diagram schematically illustrating a computing system 700 including a memory system 710, according to an embodiment of the present invention.

Referring to FIG. 16, the computing system 700 according to the embodiment may include the memory system 710, a microprocessor (or CPU) 720, a RAM 730, a user interface 740, a modem 750 such as a baseband chipset, which are electrically coupled to a system bus 760. In an embodiment, the computing system 700 may be a mobile device, in which case a battery (not shown) for supplying the operating voltage of the computing system 700 may be additionally provided. Although not shown in the drawing, it should become apparent to a person skilled in the art that the computing system 700 may further comprise an application chipset, a COMS image sensor (CIS), a mobile DRAM, and so on. The memory system 710 may be configured, for example, as an SSD (solid state drive/disk) which uses a nonvolatile memory to store data. Also as an example, the memory system 710 may be provided as a fusion flash memory for example, a NAND or a NOR flash memory.

The above-described embodiments are realized not only by a device and a method, but they may be realized also by a program which performs a function corresponding to the configuration of each embodiment or a recording medium on which the program is recorded. Such realization may be easily derived from the descriptions of the above-described embodiments by a person skilled in the art to which the embodiments pertain.

Although various embodiments have been described for illustrative purposes, it will be apparent to those skilled in the art that various changes and modifications may be made without departing from the spirit and scope of the invention as defined in the following claims.

What is claimed is:

1. A nonvolatile memory device comprising:
a plurality of well regions formed in a substrate and arranged in a first direction;
a memory block including a plurality of sub blocks which are formed over the substrate and correspond to the well regions, respectively; and
a plurality of bit lines disposed over the memory block, and extending in the first direction,
wherein each of the sub blocks includes:
a plurality of channel layers which are formed in a vertical direction between a corresponding well region and the bit lines; and
a plurality of word lines, at least one drain select line and at least one erase prevention line, which are stacked over the substrate along the channel layers,
wherein, in an erase operation, an erase voltage is applied to a well region corresponding to a selected sub block and an erase preventing voltage is applied to an erase prevention line included in an unselected sub block.

2. The nonvolatile memory device according to claim 1, wherein erase prevention lines which are included in the different sub blocks are electrically decoupled from each other.

3. The nonvolatile memory device according to claim 1, wherein word lines which are included in the different sub blocks at the same height are electrically coupled in common.

4. The nonvolatile memory device according to claim 1, wherein, among the channel layers, channel layers which are included in the different sub blocks and are arranged in line along the first direction are electrically coupled to one of the bit lines.

5. The nonvolatile memory device according to claim 1, wherein the erase preventing voltage is equal to or higher than the erase voltage.

6. The nonvolatile memory device according to claim 1, wherein, in the erase operation, an erase prevention line included in the selected sub block is supplied with the erase preventing voltage or is floated.

7. A nonvolatile memory device comprising:
a plurality of well regions formed in a substrate and arranged in a first direction;
a memory block including a plurality of sub blocks which are formed over the substrate and correspond to the well regions, respectively; and
a plurality of bit lines disposed over the memory block, and extending in the first direction,
wherein each of the sub blocks includes:
a plurality of channel layers which are formed in a vertical direction between a corresponding well region and the bit lines; and a plurality of word lines and at least one drain select line, which are stacked over the substrate along the channel layers, wherein, in an erase operation, an erase voltage is applied to a well region corresponding to a selected sub block and an erase preventing voltage is applied to a drain select line of an unselected sub block.

8. The nonvolatile memory device according to claim 7, wherein drain select lines which are included in the different sub blocks are electrically decoupled from each other.

9. The nonvolatile memory device according to claim 7, wherein the erase preventing voltage is lower than the erase voltage and is higher than a voltage applied to the word lines in the erase operation.

10. The nonvolatile memory device according to claim 7, wherein each of the sub blocks includes a plurality of drain select lines which are stacked over the word lines in the vertical direction, and wherein a highest erase preventing voltage is applied to an uppermost drain select line among drain select lines of the unselected sub block, and, as a drain select line is closer to the word lines, an erase preventing voltage having a lower level is applied to the corresponding drain select line.

11. The nonvolatile memory device according to claim 7, wherein each of the sub blocks includes at least one dummy word line which is disposed between the word lines and the drain select line and through which the channel layers pass, and wherein, in the erase operation, the erase preventing voltage is applied to a dummy word line included in the unselected sub block.

12. The nonvolatile memory device according to claim 11, wherein dummy word lines which are included in different sub blocks are electrically decoupled from each other.

13. The nonvolatile memory device according to claim 11, wherein the erase preventing voltage applied to the dummy word line is lower than the erase preventing voltage applied to the drain select line and is higher than a voltage applied to the word lines in the erase operation.

14. A nonvolatile memory device comprising:

a plurality of well regions formed in a substrate and arranged in a first direction;

a memory block including a plurality of sub blocks which are formed over the substrate and correspond to the well regions, respectively; and a plurality of bit lines disposed over the memory block, and extending in the first direction, wherein each of the sub blocks includes a plurality of cell strings which are coupled between a corresponding well region and the bit lines, and each of the cell strings includes a plurality of memory cells and at least one erase prevention transistor, which are coupled between the corresponding well region and a corresponding bit line, and wherein, in an erase operation, an erase voltage is applied to a well region corresponding to a selected sub block and an erase preventing voltage is applied to gates of erase prevention transistors of cell strings included in an unselected sub block.

15. The nonvolatile memory device according to claim 14, wherein each of the cell strings further includes at least one drain select transistor which is coupled between the memory cells and the erase prevention transistor.

16. The nonvolatile memory device according to claim 15, wherein the erase preventing voltage is equal to or higher than the erase voltage.

17. The nonvolatile memory device according to claim 14, wherein the erase prevention transistor included in each cell string includes at least one drain select transistor which is coupled between the memory cells and a corresponding bit line.

18. The nonvolatile memory device according to claim 17, wherein the erase preventing voltage is lower than the erase voltage and is higher than a voltage applied to gates of the memory cells in the erase operation.

19. The nonvolatile memory device according to claim 14, wherein the erase prevention transistor included in each cell string includes at least one drain select transistor which is coupled between the memory cells and the corresponding bit line, and at least one dummy memory cell which is coupled between the memory cells and the drain select transistor.

20. The nonvolatile memory device according to claim 19, wherein an erase preventing voltage applied to a gate of the drain select transistor is lower than the erase voltage, and wherein an erase preventing voltage applied to a gate of the dummy memory cell is lower than the erase preventing voltage applied to the gate of the drain select transistor and is higher than the voltage applied to gates of the memory cells in the erase operation.

* * * * *